(12) United States Patent
Beerens et al.

(10) Patent No.: US 8,334,983 B2
(45) Date of Patent: Dec. 18, 2012

(54) LITHOGRAPHIC APPARATUS AND DEVICE MANUFACTURING METHOD

(75) Inventors: Ruud Antonius Catharina Maria Beerens, Roggel (NL); Sjoerd Nicolaas Lambertus Donders, Vught (NL); Engelbertus Antonius Fransiscus Van Der Pasch, Oirschot (NL); Johannes Petrus Martinus Bernardus Vermeulen, Helmond (NL); Fransiscus Mathijs Jacobs, Asten (NL)

(73) Assignee: ASML Netherlands B.V., Veldhoven (NL)

( * ) Notice: Subject to any disclaimer, the term of this patent is extended or adjusted under 35 U.S.C. 154(b) by 358 days.

(21) Appl. No.: 12/768,883

(22) Filed: Apr. 28, 2010

(65) Prior Publication Data

US 2010/0297561 A1    Nov. 25, 2010

Related U.S. Application Data

(60) Provisional application No. 61/180,595, filed on May 22, 2009.

(51) Int. Cl.
*G01B 11/02* (2006.01)
(52) U.S. Cl. ...................................................... 356/499
(58) Field of Classification Search .................. 356/499, 356/521, 616
See application file for complete search history.

(56) References Cited

U.S. PATENT DOCUMENTS

| | | | |
|---|---|---|---|
| 7,332,709 B2 * | 2/2008 | Imai | 250/231.14 |
| 2007/0223007 A1 * | 9/2007 | Klaver et al. | 356/499 |

* cited by examiner

*Primary Examiner* — Michael A Lyons
(74) *Attorney, Agent, or Firm* — Pillsbury Winthrop Shaw Pittman LLP

(57) ABSTRACT

A lithographic apparatus is provided with an optical encoder measurement system having an irradiation system to direct an irradiation beam to a first scale. The system has optics to direct a primary diffracted beam diffracted from the first scale upon irradiation by the irradiation beam to a second scale and a detector to detect a secondary diffracted beam after interference and a second diffraction of the primary diffracted irradiation beam on the second scale to measure the position of the first scale with respect to the second scale.

20 Claims, 6 Drawing Sheets

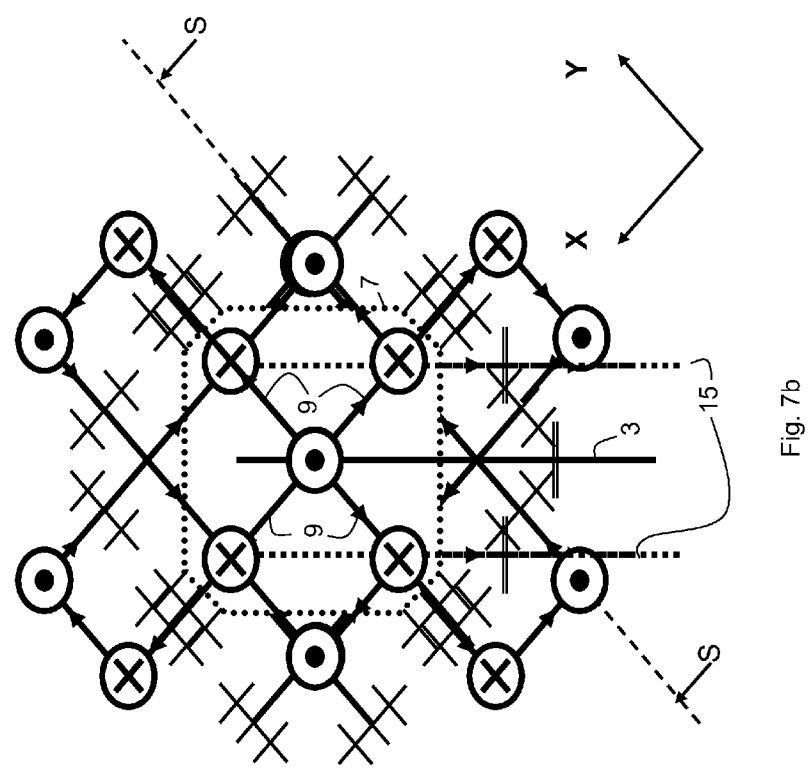

LITHOGRAPHIC APPARATUS AND DEVICE MANUFACTURING METHOD

CROSS REFERENCE TO RELATED APPLICATIONS

This application claims priority and benefit under 35 U.S.C. §119(e) to U.S. Provisional Patent Application No. 61/180,595, entitled "Lithographic Apparatus and Device Manufacturing Method", filed on May 22, 2009. The content of that application is incorporated herein in its entirety by reference.

FIELD

The present invention relates to a lithographic apparatus and methods.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The apparatus may be provided with an optical encoder measurement system including an irradiation system to direct an irradiation beam to a first scale for measuring a position of the first scale with respect to the optical encoder measurement system. The scale may for example be provided to a metrology frame while the optical encoder measurement system is provided to a substrate table so that the position of the substrate table with respect to the metrology frame can be measured. When the optical encoder system is provided to the substrate table, fibers/cables to the optical encoder system may move at high speed with the substrate table, deteriorating the dynamics and thermal behaviour of the substrate table.

SUMMARY

It is desirable to provide a lithographic apparatus with an improved optical encoder system.

According to an embodiment of the invention, there is provided a lithographic apparatus including an illumination system configured to condition a radiation beam; a support constructed to support a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate; and, wherein the apparatus is provided with an optical encoder measurement system including: an irradiation system to direct an irradiation beam to a first scale; optics to direct a primary diffracted beam diffracted from the first scale upon irradiation by the irradiation beam to a second scale; and, a detector to detect a secondary diffracted beam after interference and a second diffraction of the primary diffracted irradiation beam on the second scale to measure the position of the first scale with respect to the second scale.

According to an embodiment of the invention there is provided a device manufacturing method including: transferring a pattern from a patterning device onto a substrate; measuring a position of a first scale with respect to a second scale with an encoder measurement system by irradiating an irradiation beam on a first grating; projecting a first image of the first grating on a second grating with optics and detecting a second image of the second scale on which the first image is projected.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 7a-7b depict an optical encoder measurement system according to an embodiment of the invention for use in the apparatus according to FIG. 1.

DETAILED DESCRIPTION

Figure 1:
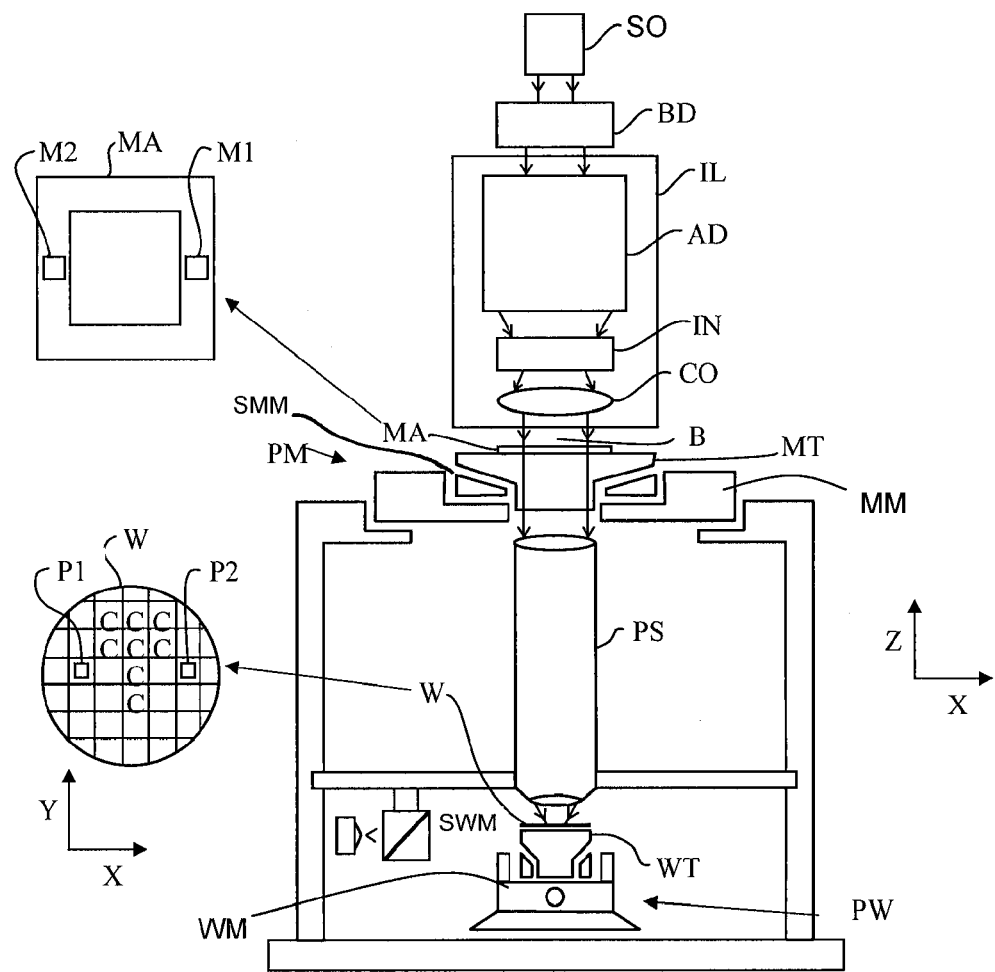
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support or support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and a position sensor (e.g. an interferometric device, optical encoder measurement system or capacitive sensor), the substrate table WT can be moved accurately, e.g. so as to position different target portions C in the path of the radiation beam B. Similarly, the first positioning device PM and another position sensor (e.g. an interferometric device, optical encoder measurement system or capacitive sensor) can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the patterning device support (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

The depicted apparatus could be used in at least one of the following modes:

1. In step mode, the patterning device support (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the patterning device support (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the patterning device support (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2A:
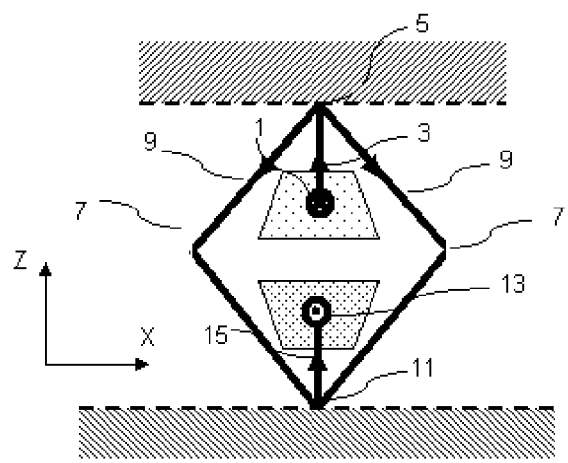
FIGS. 2a, 2b and 2c depict an optical encoder measurement system according to an embodiment of the invention for use in the apparatus according to FIG. 1.
Figure 2B:
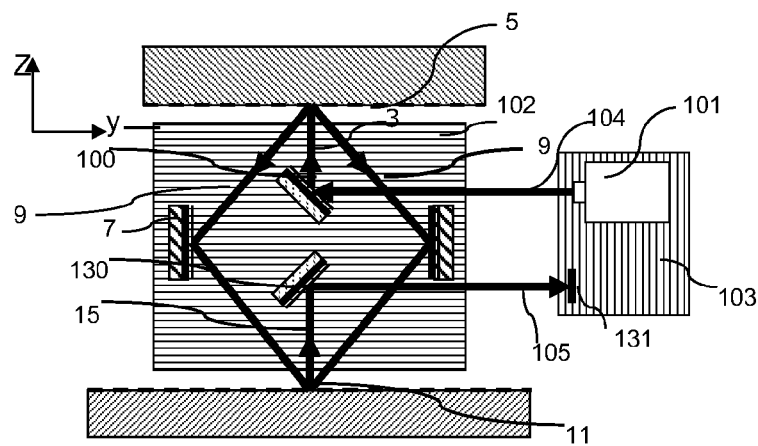
Figure 2C:
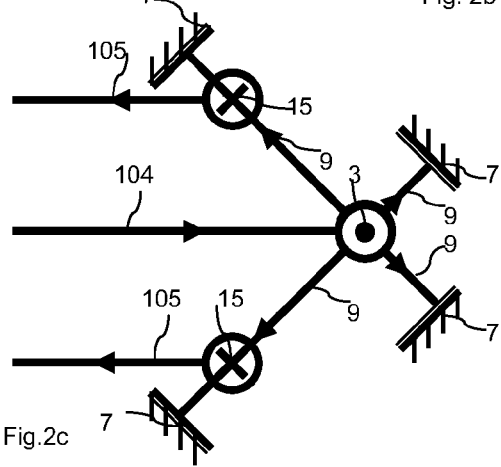

FIGS. 2a, 2b and 2c depict an optical encoder measurement system according to an embodiment of the invention. FIG. 2a is a side view in the X, Z plane and FIG. 2b is a side view in the Y, Z plane perpendicular to FIG. 2a.

The optical encoder measurement system includes an irradiation system 1 provided with an irradiation mirror 100 and an irradiation source 101 to direct an irradiation beam 3 to a first scale 5 provided to the lithographic apparatus of FIG. 1. The system may be provided with mirrors 7 functioning as optics to direct primary diffracted beams 9 diffracted from the first scale 5 upon irradiation by the irradiation beam 3 to a second scale 11. The first and or second scale 5, 11, may be one or two dimensional diffraction structures e.g. cross gratings or chessboard patterns which diffract the light in multiple directions and the optics may be mirrors so as to direct the primary diffracted beams from the first scale 5 on the second scale 11. The first and/or second scales are repetitive structures. As such, the scales can be either reflective or refractive. The mirrors 7 may be polarizing mirrors so as to change the polarization of the diffracted beams. Two dimensional diffraction structures make it possible to measure the direction in two dimensions, for example X and Y. The system may have a detector 13 provided with a detection mirror 130 and a detection sensor 131 to detect a secondary diffracted beam 15 after a second diffraction of the primary diffracted beams 9 on the second scale 11 to measure the position of the first scale 5 with respect to the second scale 11. The mirrors 7, 100 and 130 may be mounted on the long stroke mover 102, WM, MM and the irradiation source 101 and the detection sensor 131 may be mounted elsewhere, for example on a balance mass 103 which may be moving with respect to the long stroke mover 102, WM, MM without disturbing the measurement system. The benefit being that the passive components of the optical encoder measurement system such as the mirrors 7, 100 and 130 are provided on a more heat sensitive location than the active components such as the irradiation source 101 and the detection sensor 131. Another benefit of this configuration is that no cables need to go to the long stroke mover 102, WM, MM.

FIG. 2c is a top view in the X, Y plane perpendicular to FIGS. 2a and 2b. Irradiation beam 3, 104, irradiated by the irradiation source is directed in the Z-direction out of the plane of FIG. 2c and is diffracted on a two dimensional grating (not shown) which is tilted 45 degrees with respect to the irradiation beam 104. The grating diffracts the beam in four primary diffracted beams 9 which are directed by the mirrors 7 to the second grating (not shown) which diffracts the beam for the second time in the direction of the detector mirror which reflects the secondary diffracted beam 15, 105 to a detection sensor.

In some embodiments, described in more detail below, one or more additional diffractions of the secondary diffracted beams (either on the first or second scale) can occur prior to the detection of the secondary diffracted beams by the detector. The secondary diffracted beams may undergo one or more yet further diffractions on the first and/or second scale before being received by the detector.

The position of the first scale 5 with respect to a second scale 11 can be measured by irradiating an irradiation beam 3 on a first scale 5 and projecting a first image of the first scale 5 on a second scale 11 with optics 7 and detecting a second image of the second scale 11 on which the first image is projected with a detector 13. The first scale 5 may be provided to a first part and the second scale may be provided on a second part of the lithographic apparatus of FIG. 1.

The first scale 5 may be provided on patterning device MA (in FIG. 1) e.g. a mask and the second scale 11 may be provided on a metrology frame which is connected to the projection system PS. Movement of the patterning device table MT may be realized with the aid of a long-stroke module for coarse moving a long stroke mover 102, MM and a short-stroke module SMM for fine moving the patterning device MA with respect to the long stroke mover MM, which modules and mover form part of the first positioning device PM. The passive components of the optical encoder measurement system may be provided to the first positioning device PM, more particularly the components may be provided to the long stroke mover 102, MM. The benefit of this embodiment is that the patterning device MA may be too small to provide space for the first scale 5 over the full range of movement of the first positioning device PM if the optical encoder measurement system is provided to the projection system PS and the first scale 5 to the patterning device MA By providing the optical encoder measurement system to the long stroke mover 102, MM and measuring scales provided on the patterning device MA and on a metrology frame, the scale on the patterning device may be relatively small.

The first scale 5 may be provided to substrate table WT (in FIG. 1) and the second scale 11 may be provided to a metrology frame which is connected to the projection system PS. Movement of the substrate table WT or "substrate support" may be realized using a long-stroke module for coarse moving a long stroke substrate mover 102, WM and a short-stroke module SWM for fine moving the substrate table WT with respect to the long stroke substrate mover 102, WM, which modules and mover form part of the second positioner PW. A benefit is that the dynamic and thermal requirements for the long stroke substrate mover WM are less critical than for the projection system PS and or the substrate table WT, which makes it easier to build an optical encoder measurement system with the right dynamic and thermal requirements.

In general, the second scale 11, which can e.g. be applied as reference scale, can be positioned at various locations in the lithographical apparatus as shown in FIG. 1 including, but not being limited to, the projection system PS, the mask table MT, the long stroke mover MM, the substrate table WT or the long stroke substrate mover WM. Furthermore, it is worth noting that the first and second scale may also be mounted on the same (monolithic) structure in order to determine or monitor any deformations of the structure. As such, the optical encoder measurement system may enable or facilitate a non-rigid body control of a structure as applied in the lithographical apparatus as e.g. shown in FIG. 1.

Depending on the position of the various components including the scales, the irradiation source, the optics and detectors, different metrology architectures can be obtained:
  the irradiation source and detectors, all optics, and the second scale can be arranged in one sensor housing (i.e. a common housing), resulting in a non-wireless set-up,
  the irradiation source detectors, and all optics in can be arranged in one sensor housing resulting in a non-wireless set-up,
  the illumination source and all optics can be arranged in one housing resulting in a partially wireless set-up,
  the detectors and all optics can be mounted in one housing resulting in a partially wireless set-up,
  the second scale, and all optics can be mounted in one housing resulting in a wireless set-up),
  all optics can be mounted in one housing resulting in a wireless set-up.
In the latter two configurations, the irradiation source and detectors can be part of a single component or not.

Figure 3:
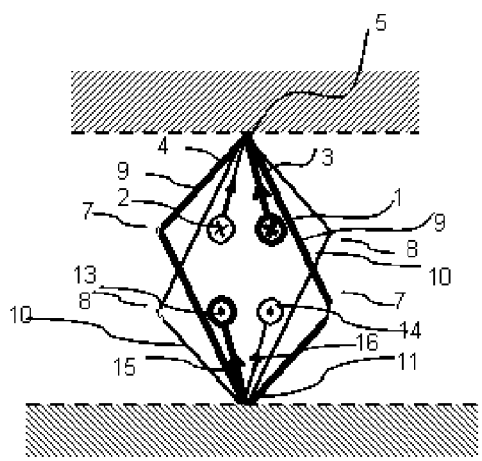
FIG. 3 depicts an optical encoder measurement system according to an embodiment of the invention for use in the apparatus according to FIG. 1.

FIG. 3 depicts an optical encoder measurement system according to an embodiment of the invention. The optical encoder measurement system comprises a first and second irradiation system 1, 2 to direct a first and second irradiation beam 3, 4 to the first scale 5 provided to a first part of the lithographic apparatus of FIG. 1. The system may be provided with mirrors 7, 8 functioning as optics to direct primary diffracted beams 9, 10 diffracted from the first scale 5 upon irradiation by the irradiation beams 3, 4 to the second scale 11. The system may have detectors 13, 14 to detect secondary diffracted beams 15, 16 after a second diffraction of the primary diffracted beams 9, 10 on the second scale 11 to measure the position of the first scale 5 with respect to the second scale 11. The system according to FIG. 3 may measure the position of the first and second scale 5, 11 with respect to each other in three dimensions X, Y and Z. A benefit is that with this "double" optical encoder system also information with respect to the Z direction is obtained.

Figure 4:
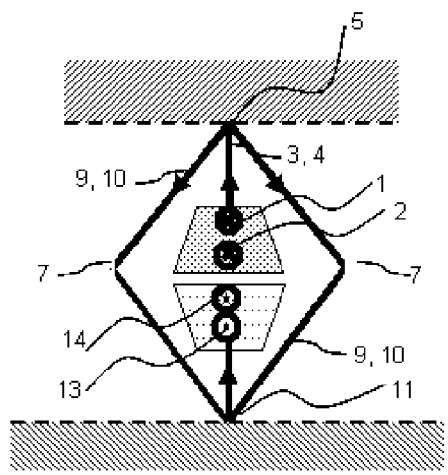
FIG. 4 depicts an optical encoder measurement system according to an embodiment of the invention for use in the apparatus according to FIG. 1.

FIG. 4 depicts an optical encoder measurement system according to an embodiment of the invention. The optical encoder measurement system includes a first and second irradiation system 1, 2 to direct a first and second irradiation beam 3, 4 to the first scale 5 provided to a first part of the lithographic apparatus of FIG. 1. The system may be provided with mirrors 7 functioning as optics to direct primary diffracted beams 9, 10 diffracted from the first scale 5 upon irradiation by the irradiation beams 3, 4 to the second scale 11. The system may have detectors 13, 14 to detect secondary diffracted beams 15, 16 after a second diffraction of the primary diffracted beams 9, 10 on the second scale 11 to measure the position of the first scale 5 with respect to the second scale 11. The system according to FIG. 4 is less sensitive to so called Abbe errors, which may be caused by tilting the optical encoder measurement system relative to the first and or second scale 5, 11.

Figure 5:
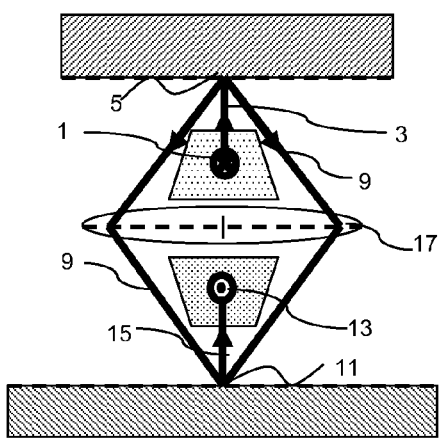
FIG. 5 depicts an optical encoder measurement system according to an embodiment of the invention for use in the apparatus according to FIG. 1.

FIG. 5 depicts an optical encoder measurement system according to an embodiment of the invention. The optical encoder measurement system includes an irradiation system 1 to direct an irradiation beam 3 to a first scale 5. The system may be provided with refractive lens 17 functioning as optics to direct primary diffracted beams 9 diffracted from the first scale 5 upon irradiation by the irradiation beam 3 to a second scale 11. Refractive lens 17 may be replaced with mirrors as described before. The system may have a detector 13 to detect a secondary diffracted beam 15 after a second diffraction of the primary diffracted beams 9 on the second scale 11 to measure the position of the first scale 5 with respect to the second scale 11. In one embodiment, the optics is circle symmetric so as to project a two dimensional image of the first scale on the second scale.

Figure 6:
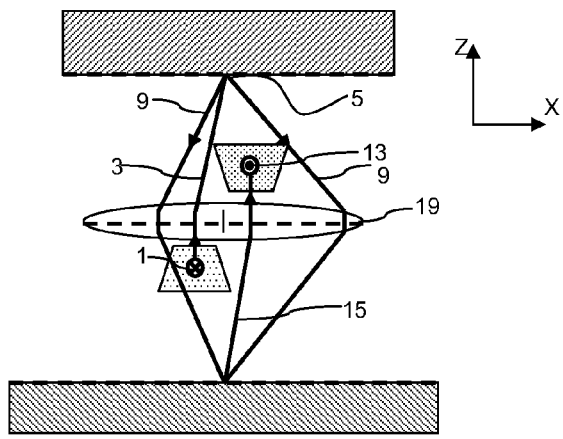
FIG. 6 depicts an optical encoder measurement system according to an embodiment of the invention for use in the apparatus according to FIG. 1.

FIG. 6 depicts an optical encoder measurement system according to an embodiment of the invention. The optical encoder measurement system includes an irradiation system 1 to direct an irradiation beam 3 to a first scale 5. The system may be provided with diffractive grating 19 functioning as optics to direct primary diffracted beams 9 diffracted from the first scale 5 upon irradiation by the irradiation beam 3 to a second scale 11. Diffractive grating 19 may be replaced with a refractive lens or a mirror as described before. The system may have a detector 13 to detect a secondary diffracted beam 15 after a second diffraction of the primary diffracted beams 9 on the second scale 11 to measure the position of the first scale with respect to the second scale 11. A benefit of the this embodiment may be that with this optical encoder system having the detector and the irradiation system off-axis of the optics (e.g. diffractive grating 19) also information with respect to the Z direction is obtained.

In one embodiment, one of the first and second scales is moveable with respect to the optical encoder measurement system over a relatively short range and the other one of the first and second scales is moveable over a relatively long range.

Figure 7A:
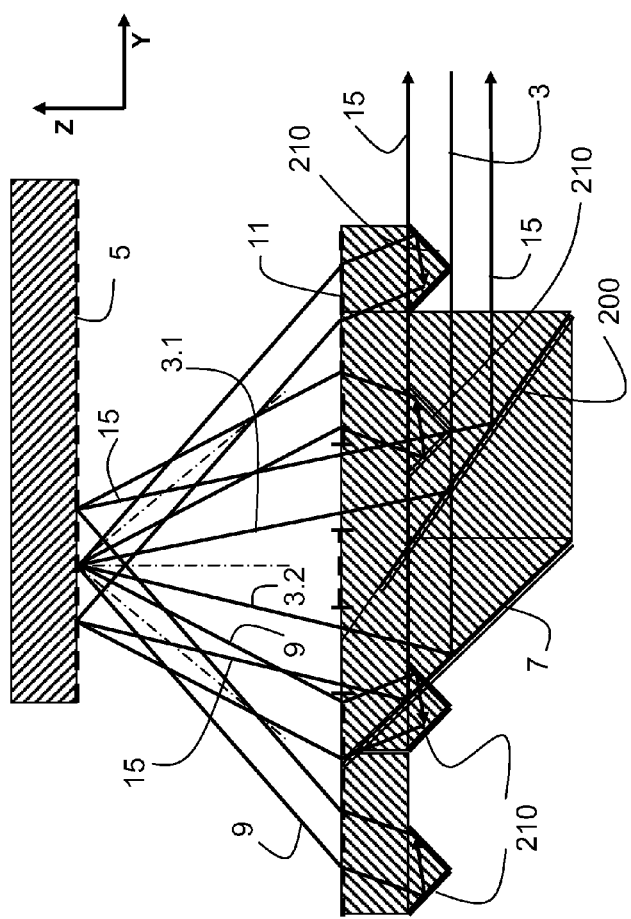

FIGS. 7*a*-7*b* depict an optical encoder measurement system according to an embodiment of the invention. FIG. 7*a* depicts a side view in the Y, Z plane along cross-section S-S as indicated in FIG. 7*b*, FIG. 7*b* depicting a top view in the X, Y plane perpendicular to FIG. 7*a*. The optical encoder measurement system includes an irradiation system (not shown) to direct an irradiation beam 3 to a first scale 5. The irradiation beam 3 passes a beam splitter 200 thus providing a first irradiation beam 3.1 towards the first scale 5 and a second irradiation beam 3.2 which is provided to the first scale via a mirror 7. It will be appreciated that, instead of a beam splitter, two incoming irradiation beams could also be applied. The irradiation beams 3.1 and 3.2 are diffracted on a two dimensional grating (not shown) which is tilted 45 degrees with respect to the irradiation beam 3 resulting in primary diffracted beams 9. The primary diffracted beams 9 resulting from the diffraction of the first and second irradiation beam 3.1 and 3.2 are subsequently directed towards the second scale 11, diffract upon the second scale towards rooftop prisms 210 functioning as optics to direct the diffracted beams towards the second scale 11, again towards the first scale 5. Subsequently, the secondary diffracted beams 15 thus obtained are directed, via the mirror 7 or beam splitter 200 towards a detector (not shown). In the arrangement as shown, the irradiation beams 3.1 and 3.2 are directed towards the first scale in a direction which is not perpendicular to a plane comprising the scale. By doing so, information with respect to the Z direction may be obtained. As such, by using a 2-dimensional first and second scale 5, 11, the position of the first and second scale with respect to each other can be measured in three dimensions X, Y and Z.

Figure 8:
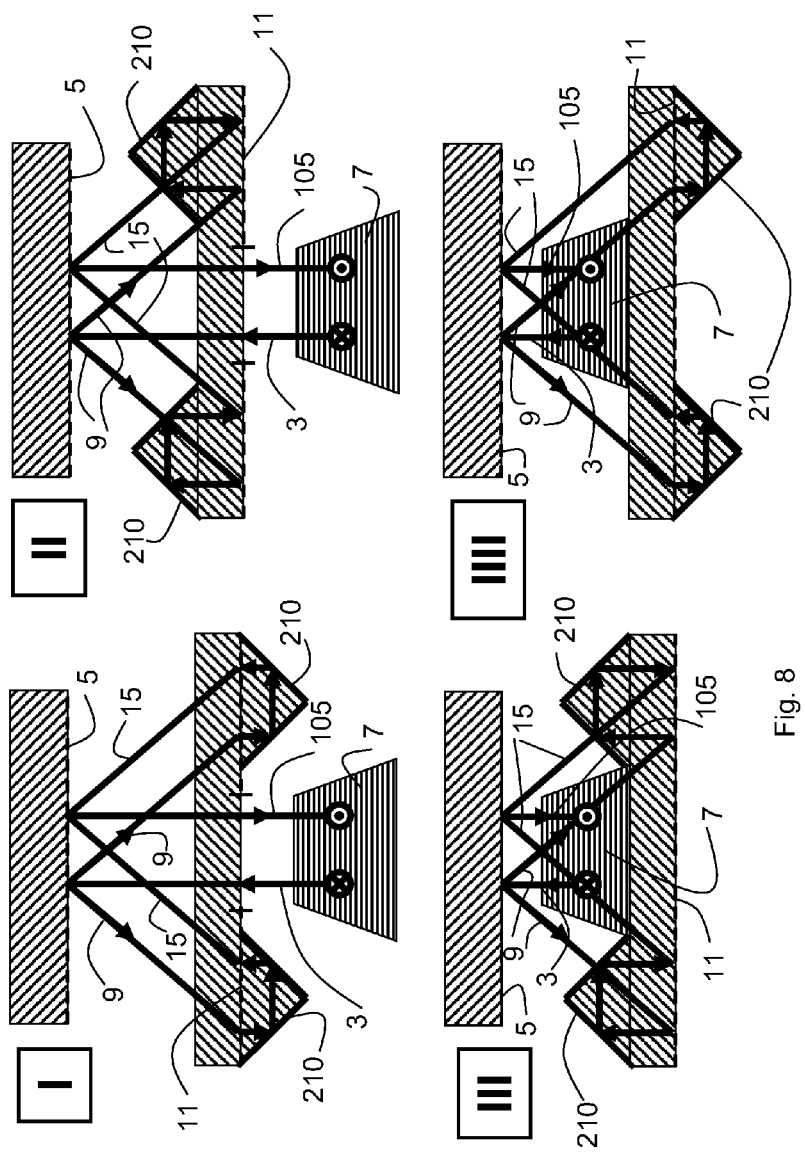
FIG. 8 depicts four further arrangements of the optical encoder measurement system according to an embodiment of the invention for use in the apparatus according to FIG. 1.

In FIG. 8, four further arrangements (I, II, III, IIII) of an optical encoder measurement system according to the sixth embodiment are shown (in an X, Z plane), showing different arrangements of the first scale 5, the second scale 11, the mirror 7 and the rooftop prisms 210 (as also shown in FIG. 7a) relative to each other. The configurations as shown enable determining a relative position of the first scale 5 with respect to a second scale 11 using an incoming radiation beam 3 which is diffracted on the first and second scale. As shown, an incoming radiation beam 3 (e.g. perpendicular to the plane of the figure) is reflected by a mirror 7 onto the first scale 5 and diffracted towards the second scale 11. Near the second scale, use is made from so-called rooftop prisms 210 to reflect a diffracted beam (i.e. diffracted at the second scale) again towards the second scale whereupon a yet further diffraction occurs thus obtaining secondary diffracted beams 15. Subsequently, the secondary diffracted beams 15 leaving the second scale 11 are diffracted again on the first scale, forming outgoing beam 105, before being received, via the mirror 7, by a detector (not shown). Taking into account the volume available for the measurement system, the various options as shown provide alternative positions for the mirror 7, the scales 5 and 11 and the rooftop prisms 210.

The optical encoder measurement system may be provided with a transmittal system for providing wireless data transfer to a machine control system controlling the functioning of the lithographic projection apparatus. The transmittal system can make use of an antenna for transmitting the data using electromagnetic radiation or it may us an infrared transmitter. The machine control system may have an antenna for receiving the electromagnetic radiation or an infra red receiver for the data transfer. A benefit of the wireless data transfer is that fewer cables and or fibres need to be provided to the optical encoder measurement system improving the dynamic behaviour of the lithographic apparatus.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
   a support constructed to support a patterning device, the patterning device being capable of imparting a radiation beam with a pattern in its cross-section to form a patterned radiation beam;
   a substrate table constructed to hold a substrate;
   a projection system configured to project the patterned radiation beam onto a target portion of the substrate; and,
   an optical encoder measurement system including an irradiation system configured to direct an irradiation beam to a first scale;
      optics configured to direct a primary diffracted beam diffracted from the first scale upon irradiation by the irradiation beam to a second scale; and,
      a detector configured to detect a secondary diffracted beam resulting from a second diffraction of the primary diffracted irradiation beam on the second scale to measure the position of the first scale with respect to the second scale,
   wherein the optics are mounted on a mover that is movable relative to the irradiation system, or the detector or both the irradiation system and the detector.

2. The apparatus of claim 1, wherein the first and second scales are moveable with respect to the optical encoder measurement system.

3. The apparatus of claim 1, wherein the first scale is provided on the patterning device or the substrate table, and the second scale is provided on a metrology frame or the projection system.

4. The apparatus of claim 1, comprising a positioning device comprising a short stroke module configured to move the patterning device or the substrate with respect to a long stroke mover, wherein the optics of the optical encoder measurement system are provided on the long stroke mover.

5. The apparatus of claim 1, wherein the first and/or second scales are repetitive structures and the encoder measurement system is constructed and arranged to measure a position of the first scale with respect to the second scale in at least one direction.

6. The apparatus of claim 1, wherein the irradiation system and the optics are mounted in a common housing.

7. The apparatus of claim 1, wherein the detector and the second scale are mounted in a common housing.

8. The apparatus of claim 1, wherein the first and second scale are two-dimensional gratings extending in an XY-plane.

9. The apparatus of claim 1, wherein the optics comprises a mirror, diffractive, refractive or polarizing optics and/or, wherein the optics is circle symmetric so as to project a two dimensional image of the first scale on the second scale.

10. The apparatus of claim 1, wherein one of the first and second scales is moveable with respect to the optical encoder measurement system over a relatively short range and the other one of the first and second scales is moveable over a relatively long range.

11. The apparatus of claim 1, wherein the irradiation system includes an irradiation mirror and an irradiation source and the detector includes a detection mirror and detection sensor and the irradiation and detection mirror is moveable with respect to the irradiation source and the detection sensor.

12. The apparatus of claim 1, wherein the apparatus is constructed and arranged so that the optical encoder measurement system is positioned between the first and the second scale.

13. The apparatus of claim 1, wherein the optical encoder measurement system comprises a second irradiation system configured to provide a measurement beam on the first scale, which beam is diffracted by the first scale in the direction of the optics of the optical encoder measurement system, the optics directing the diffracted beam to the second scale which diffract the diffracted beam onto a second detector of the optical encoder measurement system.

14. The apparatus of claim 1, wherein the optical encoder measurement system is constructed and arranged to measure the position of the first scale with respect to the second scale in a third direction substantially perpendicular to a surface of the first and second scale.

15. The apparatus of claim 1, wherein the optical encoder measurement system is constructed and arranged to be insensitive to a tilt of the optical encoder measurement system relative the first scale and or second scale.

16. A device manufacturing method comprising:
transferring a pattern from a patterning device onto a substrate;
measuring a position of a first scale with respect to a second scale with an optical encoder measurement system by irradiating a first grating with an irradiation beam;
projecting a first image of the first grating on a second grating with optics and detecting a second image of the second scale on which the first image is projected.

17. An optical encoder measurement system comprising:
an irradiation system configured to direct an irradiation beam to a first scale;
optics configured to direct a primary diffracted beam diffracted from the first scale upon irradiation by the irradiation beam to a second scale; and
a detector configured to detect a secondary diffracted beam resulting from a second diffraction of the primary diffracted irradiation beam on the second scale to measure the position of the first scale with respect to the second scale,
wherein the optics are mounted on a mover that is movable relative to the irradiation system, or the detector or both the irradiation system and the detector.

18. The system of claim 17, wherein the first and second scales are moveable with respect to the optical encoder measurement system.

19. The system of claim 17, wherein the first scale is provided on a patterning device configured to pattern a beam of radiation in a lithographic apparatus and the second scale is provided on a metrology frame.

20. The system of claim 17, wherein the first scale is provided on a substrate table configured to support a substrate in a lithographic apparatus and the second scale is provided on a metrology frame.

* * * * *